(12) United States Patent
Chien

(10) Patent No.: US 10,996,502 B2
(45) Date of Patent: May 4, 2021

(54) DISPLAY PANEL AND METHOD OF MANUFACTURING THE SAME

(71) Applicants: HKC Corporation Limited, Guangdong (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/492,573

(22) PCT Filed: Jun. 20, 2017

(86) PCT No.: PCT/CN2017/089185
§ 371 (c)(1),
(2) Date: Sep. 9, 2019

(87) PCT Pub. No.: WO2018/166088
PCT Pub. Date: Sep. 20, 2018

(65) Prior Publication Data
US 2020/0050052 A1   Feb. 13, 2020

(30) Foreign Application Priority Data
Mar. 14, 2017 (CN) .......................... 201710148705.1

(51) Int. Cl.
*G02F 1/1335* (2006.01)
*H01L 27/12* (2006.01)

(52) U.S. Cl.
CPC ...... *G02F 1/133512* (2013.01); *H01L 27/124* (2013.01); *H01L 27/1262* (2013.01)

(58) Field of Classification Search
None
See application file for complete search history.

(56) References Cited

U.S. PATENT DOCUMENTS

| | | | | |
|---|---|---|---|---|
| 2001/0030717 A1* | 10/2001 | Kaneko | ............. | G02F 1/134363 349/43 |
| 2003/0173106 A1* | 9/2003 | Hwang | ................. | G03F 7/0007 174/255 |
| 2004/0139985 A1* | 7/2004 | Hegedus | ................... | B08B 3/02 134/1.3 |
| 2005/0196911 A1* | 9/2005 | Kim | .................. | G02F 1/136286 438/149 |

(Continued)

FOREIGN PATENT DOCUMENTS

| CN | 102169251 A | 8/2011 |
|---|---|---|
| CN | 102629609 A | 8/2012 |

(Continued)

*Primary Examiner* — Edward J Glick
*Assistant Examiner* — David Y Chung
(74) *Attorney, Agent, or Firm* — Muncy, Geissler, Olds & Lowe, P.C.

(57) ABSTRACT

A display panel includes a substrate and active switches disposed on the substrate. A light-obstructing layer is disposed between the active switches and the substrate. Each of the active switches includes a semiconductor layer. The light-obstructing layer entirely covers the semiconductor layer.

14 Claims, 5 Drawing Sheets

(56) References Cited

U.S. PATENT DOCUMENTS

| | | | | |
|---|---|---|---|---|
| 2009/0014721 A1* | 1/2009 | Tanabe | .............. | H01L 29/78633 |
| | | | | 257/59 |
| 2010/0012944 A1 | 1/2010 | Cho et al. | | |
| 2013/0077034 A1* | 3/2013 | Jung | .................. | G02F 1/13452 |
| | | | | 349/122 |
| 2013/0256668 A1* | 10/2013 | Oh | .................... | H01L 29/66757 |
| | | | | 257/59 |

FOREIGN PATENT DOCUMENTS

| | | |
|---|---|---|
| CN | 103207490 A | 7/2013 |
| CN | 103258743 A | 8/2013 |
| CN | 103529608 A | 1/2014 |
| CN | 105633016 A | 6/2016 |
| CN | 105932068 A | 9/2016 |
| CN | 106328714 A | 1/2017 |

\* cited by examiner

DISPLAY PANEL AND METHOD OF MANUFACTURING THE SAME

BACKGROUND

Technical Field

This disclosure relates to a technical field of a display, and more particularly to a display panel and a method of manufacturing the same.

Related Art

The display has many advantages, such as the slim body, the power-saving property, the radiation less property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate) and a thin film transistor substrate (TFT substrate), and the transparent electrode is present on the opposite inner sides of the above-mentioned substrates. A layer of liquid crystal (LC) molecules is disposed between the two substrates. The display panel can control the directions of the liquid crystal molecules for changing the polarization of the light, and the polarizers can allow the polarized light to pass through or block the polarized light so as to carry out the display purpose.

At present, the display industry is gradually and continuously developed toward the higher definition, higher resolution, and thinner direction. Thus, the existing high-end product of display panel is designed to have more and more pixels per inch (PPI). The semiconductor layer on the active switch has the higher optical electroconductive coefficient, so the higher leakage current is generated under light exposure.

SUMMARY

The technical problem to be solved by this disclosure is to provide a display panel of reducing a light exposure leakage current of a semiconductor layer.

In addition, the disclosure also provide a method of manufacturing a display panel.

To achieve the objective, the disclosure provides a display panel comprising a substrate and active switches. The active switches are disposed on the substrate. A light-obstructing layer is disposed between the active switches and the substrate, wherein each of the active switches comprises a semiconductor layer, and the light-obstructing layer entirely covers the semiconductor layer.

In one embodiment, the light-obstructing layer comprises a first metal layer and semi-transparent layers disposed below the semiconductor layer; the first metal layer is disposed on the semi-transparent layers, and the semi-transparent layers entirely cover the semiconductor layer.

The semi-transparent layers entirely covering the semiconductor layer can make the semi-transparent layers effectively obstruct the backlight very well, reduce the backlight illumination on the semiconductor layer very well, further reduce the light exposure leakage current of the semiconductor layer, thus effectively reduce the influence of the light exposure leakage current on the frame display, better improve the display effect of the display panel, and effectively improve the product competitiveness of the display panel.

In one embodiment, the semi-transparent layers are intervally disposed on the substrate, the first metal layer crosses an interval region between adjacent two of the semi-transparent layers, two ends of the first metal layer are respectively disposed on adjacent two of the semi-transparent layers, and the semi-transparent layers and the first metal layer entirely cover the semiconductor layer.

In one embodiment, the first metal layer and the semi-transparent layers are manufactured by using the same mask. In this manner, it is very convenient to the manufacture production of the display panel without adding a mask, and the further reduction of the manufacturing costs of the display panel. In addition, the production efficiency of the display panel can further be improved very well; the structure of the active switches is still based on four mask structures, and it is very convenient to the manufacture production of the display panel without adding a mask, and the further reduction of the manufacturing costs of the display panel. In addition, the production efficiency of the display panel can further be improved very well; and utilizing a layer of the semi-transparent layer collocating with a halftone mask can very effectively obstruct the range of the semiconductor layer exposed to the first metal layer utilizing the semi-transparent layer.

In one embodiment, each of the active switches comprises a second metal layer, the second metal layer comprises a source metal layer and a drain metal layer, the source metal layer and the drain metal layer are disposed on two ends of the semiconductor layer, a trench is disposed between the source metal layer and the drain metal layer, and a bottom portion of the trench is the semiconductor layer.

In one embodiment, a nitrogen ion layer is disposed between the semiconductor layer and each of the source metal layer and the drain metal layer. The configuration of the nitrogen ion layer can stop the holes very well, effectively avoid other leakage current appearances, can effectively reduce the influence of the light exposure leakage current on the frame display of the display panel, ensure the better display effect of the display panel, and further improve the display quality of the display panel.

In one embodiment, a lower portion of the first metal layer comprises a first high attachment metal layer, an upper portion of the first metal layer comprises a second high attachment metal layer, and a middle portion of the first metal layer comprises a middle electroconductive layer. The middle electroconductive layer may be made of the metal with the lower resistive property to effectively reduce the resistance and the parasitic capacitance of the first metal layer of the display panel. The first high attachment metal layer and the second high attachment metal layer of the first metal layer are made of the metal with the better bonding property, so that the middle electroconductive layer may be bonded and fixed to the first high attachment metal layer and the second high attachment metal layer very well.

In one embodiment, a width of a bottom portion of the middle electroconductive layer is greater than a width of a top portion of the middle electroconductive layer, and a thickness of the middle electroconductive layer is greater than a thickness of the first high attachment metal layer and a thickness of the second high attachment metal layer. The width of the bottom portion of the middle electroconductive layer 212 is greater than the width of the top portion of the middle electroconductive layer 212, so that the manufacturing is convenient, the formation is stable, and the yield is high. The width of the first high attachment metal layer 211 is equal to the width of the bottom portion of the middle electroconductive layer 212, and the width of the second high attachment metal layer 213 is the same as the width of the top portion of the middle electroconductive layer 212. This is convenient to the manufacturing. The contact area between the middle electroconductive layer 212 and each of the first high attachment metal layer 211 and the second high attachment metal layer 213 is the maximum.

In another aspect of the disclosure, the disclosure provides a method of manufacturing a display panel. The display panel comprises a substrate and active switches disposed on the substrate, and each of the active switches comprises a semiconductor layer. The method comprises steps of: disposing a semi-transparent layer material on the substrate; disposing a metal layer material on the semi-transparent layer material of the substrate; and obtaining a light-obstructing layer entirely covering the semiconductor layer by using the same halftone mask process.

The semi-transparent layer and the metal layer are manufactured through one halftone mask, and it is very convenient to the manufacture production of the display panel without adding a mask and the further reduction of the manufacturing costs of the display panel. In addition, the production efficiency of the display panel can further be improved very well.

In one embodiment, the light-obstructing layer comprises a first metal layer and semi-transparent layers disposed below the semiconductor layer. The step of obtaining the light-obstructing layer entirely covering the semiconductor layer by using the same halftone mask process comprises: disposing a photoresist material on the metal layer material; obtaining a pattern of the semi-transparent layers by using the halftone mask process; etching the metal layer material by using a wet etching process; obtaining a pattern of the first metal layer and the semi-transparent layers by using dry etching and photoresist ashing processes; obtaining the first metal layer by using a wet etching process; and removing a residual photoresist material.

According to another aspect of this disclosure, this disclosure further discloses a display device including a backlight module and the above-mentioned display panel.

In this disclosure, the configuration of a light-obstructing layer can very effectively reduce the backlight illumination on the semiconductor layer, thus reduce the light exposure leakage current, and effectively reduce the influence of the light exposure leakage current on the frame display, so that the display quality of the display panel is further improved. In addition, the covering shape of the light-obstructing layer can be adjusted according to different display panels. As long as the existing process is slightly improved, the leakage current caused by the illumination on the semiconductor layer can be better avoided, and the working stability of the display panel can be ensured so that the display panel has the better display effect.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

Figure 1:
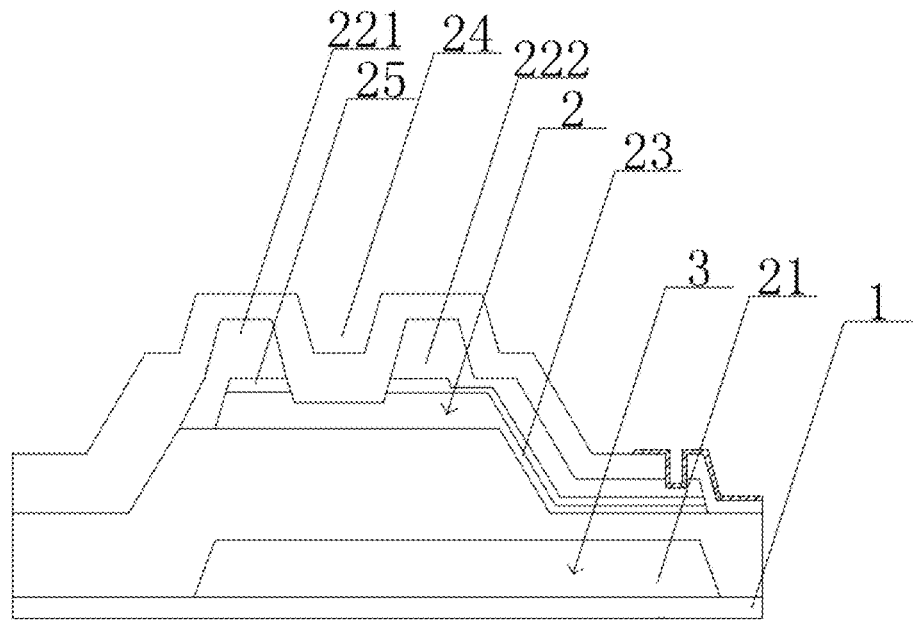
FIG. 1 is a schematically cross-sectional view showing a display panel according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

The liquid crystal display (LCD) has the properties, such as the low power consumption, the slim and light weight, the low voltage driving and the like, and has been widely used in various display applications, such as mobile phones, tablet computers, notebook computers and the like. An amorphous silicon thin-film transistor (referred to as a semiconductor layer in the following) is applied to a pixel switch of an active matrix liquid crystal display. The material of the semiconductor layer has the higher optical electroconductive coefficient, and thus has the higher leakage current under light exposure. When the panel is applied to the product, such as a multimedia display, a liquid crystal television or the like, which needs to be illuminated by the very strong backlight, reducing the light exposure leakage current has become an important subject.

In order to improve the problem of the light exposure leakage current, as shown in FIG. 1, a display panel includes a substrate 1 and an active switches 2. The active switch 2 includes a semiconductor layer 23 and a first metal layer 21 entirely covering the semiconductor layer 23.

Enlarging the area of the first metal layer 21 makes the first metal layer 21 entirely cover the semiconductor layer 23, thereby obstructing the light to the semiconductor layer 23, effectively reducing the backlight illuminance, thus reducing the light exposure leakage current, and effectively reducing the influence of the light exposure leakage current on the frame display, so that the display quality of the display panel is further improved.

It is found from further study that the first metal layer 21 cannot provide the entire covering very well for the active switch 2 corresponding to the too-large area of the semiconductor layer 23. In addition, enlarging the area of the first metal layer 21 needs to improve the process, wastes a lot of metal consumable materials, and the first metal layer 21 cannot completely stop the influence of the light illumination phenomenon on the semiconductor layer 23 caused by the backlight module under the panel. Thus, this disclosure provides a new technical solution for the display panel to better reduce the light exposure leakage current of the semiconductor layer 23.

Figure 2:
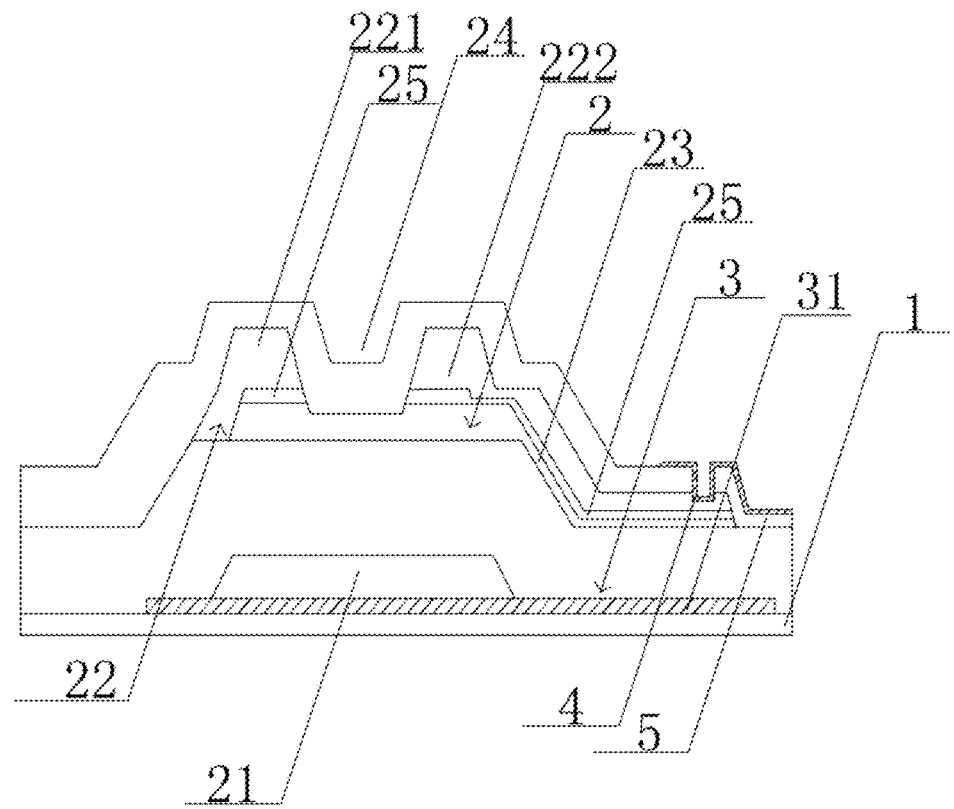
FIG. 2 is a schematically cross-sectional view showing a display panel according to another embodying method of the embodiment of this disclosure.

As shown in FIG. 2, the display panel comprises a substrate 1 and active switches 2 disposed on the substrate 1. A light-obstructing layer 3 is disposed between the active switches 2 and the substrate 1. The active switch 2 comprises a semiconductor layer 23, and the light-obstructing layer 3 entirely covers the semiconductor layer 23.

The configuration of a light-obstructing layer 3 can very effectively reduce the backlight illumination on the semiconductor layer 23, thus reduce the light exposure leakage current, and effectively reduce the influence of the light exposure leakage current on the frame display, so that the display quality of the display panel is further improved. In addition, the covering shape of the light-obstructing layer 3 can be adjusted according to different display panels. As long as the existing process is slightly improved, the leakage current caused by the illumination on the semiconductor layer 23 can be better avoided, and the working stability of the display panel can be ensured so that the display panel has the better display effect.

The light-obstructing layer 3 includes the first metal layer 21 and semi-transparent layers 31 disposed below the semiconductor layer 23. The first metal layer 21 is disposed on the semi-transparent layers 31 and the semi-transparent layers 31 entirely cover the semiconductor layer 23. The semi-transparent layers 31 entirely covering the semiconductor layer 23 can make the semi-transparent layers 31 effectively obstruct the backlight very well, reduce the backlight illumination on the semiconductor layer 23 very well, further reduce the light exposure leakage current of the semiconductor layer 23, thus effectively reduce the influence of the light exposure leakage current on the frame display, better improve the display effect of the display panel, and effectively improve the product competitiveness of the display panel.

Figure 3:
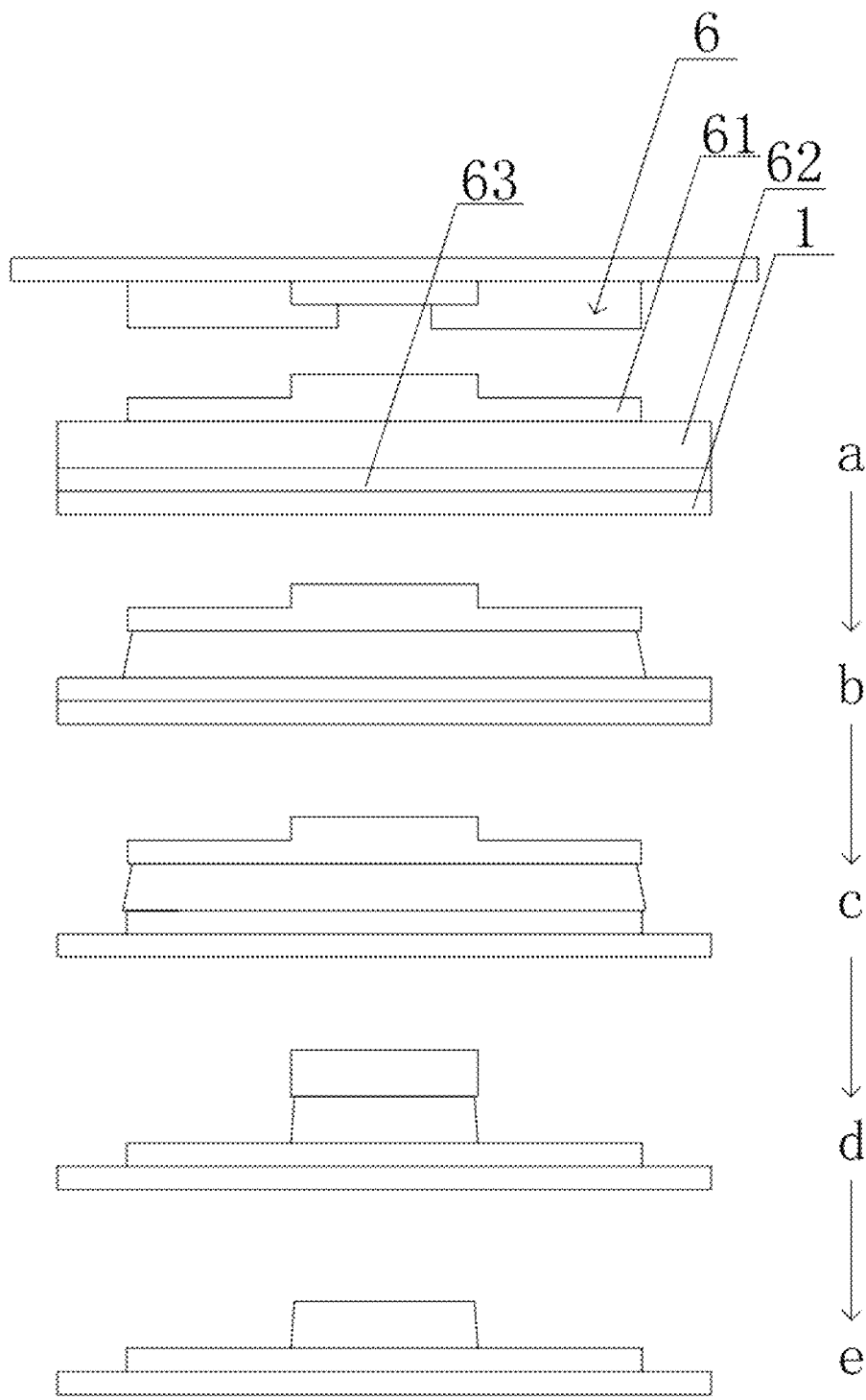
FIG. 3 is a schematic view showing one halftone mask used to manufacture a light-obstructing layer according to the embodiment of this disclosure.

As shown in FIG. 3, the first metal layer 21 and the semi-transparent layers 31 are manufactured by using the same mask. The structure of the active switches 2 is still based on four mask structures. It is very convenient to the manufacture production of the display panel without adding a mask and the further reduction of the manufacturing costs of the display panel. In addition, the production efficiency of the display panel can further be improved very well. Utilizing one semi-transparent layer 31 to cooperate with a halftone mask 6 can obstruct the range of the semiconductor layer 23 exposed to the first metal layer 21 by the semi-transparent layer 31. The same mask is performed by: firstly depositing a semi-transparent layer material 63 and a metal layer material on the substrate 1, wherein the property of the semi-transparent layer material 63 needs to be selected according to both the penetration rate and the aperture ratio; (a) then performing a photolithography process by using the half-tone mask; (b) then performing a first wet etching process on a metal layer 62; (c) then performing dry etching and photoresist ashing processes on the semi-transparent layers 31; (d) then performing a second wet etching process on the metal layer 62; and (e) finally removing the photoresist to obtain the structure preventing the backlight from illuminating the semiconductor layer 23, wherein the subsequent processes of the active switches 2 are standard processes.

The active switch 2 further includes a second metal layer 22, and the second metal layer 22 includes a source metal layer 221 and a drain metal layer 222 disposed on two ends of the semiconductor layer 23. A trench 24 is disposed between the source metal layer 221 and the drain metal layer 222. The bottom portion of the trench 24 is the semiconductor layer 23. The drain metal layer 222 is connected to and provided with a pixel electrode 4 made of an ITO film layer. The active switch 2 is covered with a protection layer 5. The protection layer 5 can avoid the direct erosion of the cleaning agent to the source metal layer 221 and the drain metal layer 222 of the liquid crystal panel very effectively, so that the source metal layer 221 and the drain metal layer 222 can be kept intact, thereby reducing the occurrence of breakage problems, thus improving the rework success rates of the active switch 2 and the array substrate, and thus reducing the scrapping cost. Because the source metal layer 221 and the drain metal layer 222 are made of metal materials, the lateral sides of the source metal layer 221 and the drain metal layer 222 have the metal burr phenomenon when viewed from the micro-structure. The configuration of the protection layer 5 can better cover the metal burr on each of the source metal layer 221 and the drain metal layer 222, and prevent the metal burr from exposing from the protection layer 5 very effectively, so that the protection layer 5 can better protect the source metal layer 221 and the drain metal layer 222, effective avoid the influence of the subsequent processes on the source metal layer 221 and the drain metal layer 222, and thus increase the yield of the display panel very well.

A nitrogen ion layer 25 is disposed between the semiconductor layer 23 and each of the source metal layer 221 and the drain metal layer 222. The configuration of the nitrogen ion layer 25 can stop the holes very well, effectively avoid other leakage current appearances, can effectively reduce the influence of the light exposure leakage current on the frame display of the display panel, ensure the better display effect of the display panel, and further improve the display quality of the display panel.

Figure 4:
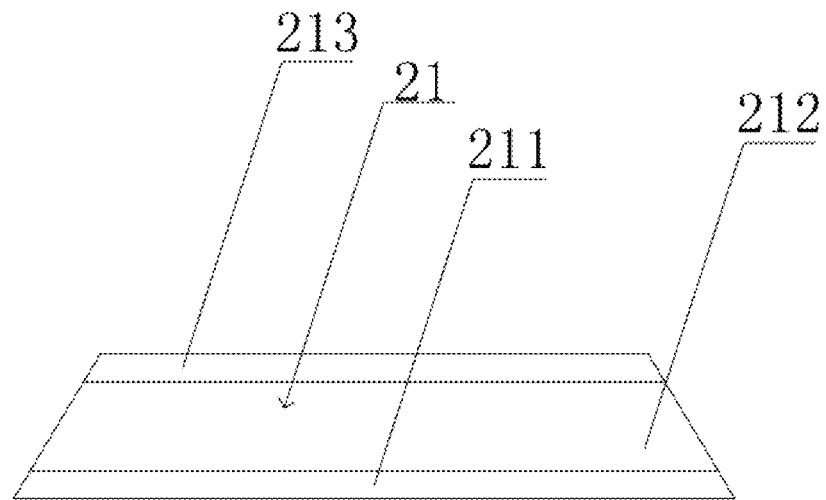
FIG. 4 is a schematic structure view showing a first metal layer according to the embodiment of this disclosure.

As shown in FIG. 4, the lower portion of the first metal layer 21 includes a first high attachment metal layer 211, the upper portion of the first metal layer 21 includes a second high attachment metal layer 213, and the middle portion of the first metal layer 21 includes a middle electroconductive layer 212. The first metal layer 21 of the display panel connected to the row scan driver adopts a three-layer structure including the first high attachment metal layer 211, the middle electroconductive layer 212 and the second high attachment metal layer 213 connected to the substrate 1 from bottom to top in order; the middle electroconductive layer 212 may be made of the metal with the lower resistive property to effectively reduce the resistance and parasitic capacitance of the first metal layer 21 of the display panel; and the first high attachment metal layer 211 and the second high attachment metal layer 213 of the first metal layer 21 are made of the metal with the better bonding property, so that the middle electroconductive layer 212 may be bonded and fixed to the first high attachment metal layer 211 and the second high attachment metal layer 213 very well. Meanwhile, the middle electroconductive layer 212 may further be bonded and fixed to the upper and lower portions through the first high attachment metal layer 211 and the second high attachment metal layer 213, so that the bonding property is better, the condition that the middle electroconductive layer 212 is peeled off the upper and lower portions cannot easily occur, the electrical property performance of the first metal layer 21 of the display panel can be satisfied very well, the middle electroconductive layer 212 can be bonded and fixed to the upper and lower portions very well, the product yield is increased, and the manufacturing cost is reduced.

The middle electroconductive layer 212 is made of copper, aluminum, silver, gold, chromium or molybdenum or an alloy of copper, aluminum, silver, gold, chromium or molybdenum. The copper, aluminum, silver, gold, chromium or molybdenum or an alloy of copper, aluminum, silver, gold, chromium or molybdenum has the better electroconductive performance and the lower resistive property, and can satisfy the requirement of the display panel. The middle electroconductive layer 212 is preferred the copper or the copper alloy, which is most cost-effective. The first high attachment metal layer 211 and the second high attachment metal layer 213 are made of molybdenum (Mo) or a molybdenum alloy. The molybdenum or molybdenum alloy can achieve the better adhesion, wherein one side thereof can be better bonded to the metal of the middle electroconductive layer 212, such as copper, aluminum, silver, gold, chromium, molybdenum or the like, and the other side can be better bonded to other layers of the display panel, such as the substrate 1, resist layer, insulating layer and the like. The materials can be easily selected, the production technology is well developed, additional raw materials are not needed, the raw material cost and the storage cost are decreased, no new material needs to be added to the bill of materials, it is convenient to the flow manage and purchase, no additional apparatus for disposing the second high attachment metal layer 213 is needed, one set of equipment apparatus may be shared with the first high attachment metal layer 211, and additional equipment and materials are also not required for post etching.

The width of the bottom portion of the middle electroconductive layer 212 is greater than the width of the top portion of the middle electroconductive layer 212, so that the manufacturing is convenient, the formation is stable, and the yield is high. The width of the first high attachment metal layer 211 is equal to the width of the bottom portion of the middle electroconductive layer 212, and the width of the second high attachment metal layer 213 is the same as the width of the top portion of the middle electroconductive layer 212. This is convenient to the manufacturing. The contact area between the middle electroconductive layer 212 and each of the first high attachment metal layer 211 and the second high attachment metal layer 213 is the maximum, and the bonding effect is better. The middle electroconductive layer 212 is preferred a trapezoid, and more particularly an isosceles trapezoid. The thickness of the middle electroconductive layer 212 is greater than the thickness of each of the first high attachment metal layer 211 and the second high attachment metal layer 213. The thickness of the middle electroconductive layer 212 is greater than the thickness of the first high attachment metal layer 211, and is also greater than the thickness of the second high attachment metal layer 213. The middle electroconductive layer 212 may be made of the metal having the lower resistive property, and has the larger thickness to effectively reduce the resistance and parasitic capacitance of the first wire layer of the display panel. The first high attachment metal layer 211 and the second high attachment metal layer 213 are made of the metal with the better bonding property. The middle electroconductive layer 212 is connected to the upper and lower portions through the first high attachment metal layer 211 and the second high attachment metal layer 213, so that the bonding property is better, and the condition that the middle electroconductive layer 212 is peeled off the upper and lower portions cannot easily occur. The first high attachment metal layer 211 and the second high attachment metal layer 213 are mainly used to be bonded to the upper and lower portions and have the small thickness to save the cost. Optionally, the thickness of the middle electroconductive layer 212 may be greater than the thickness of the first high attachment metal layer 211 plus the thickness of the second high attachment metal layer 213.

The first metal layer 21 includes a gate metal layer disposed on the active switch 2; the first metal layer 21 is provided with the second high attachment metal layer 213 only on the gate metal layer, the gate metal layer of the active switch 2 adopts the first metal layer 21 of the three-layer structure, and other wires on the substrate 1 adopt wires of the two-layer mechanism to reduce the thickness of the display panel very effectively, so that the display panel becomes further light and portable.

Figure 5:
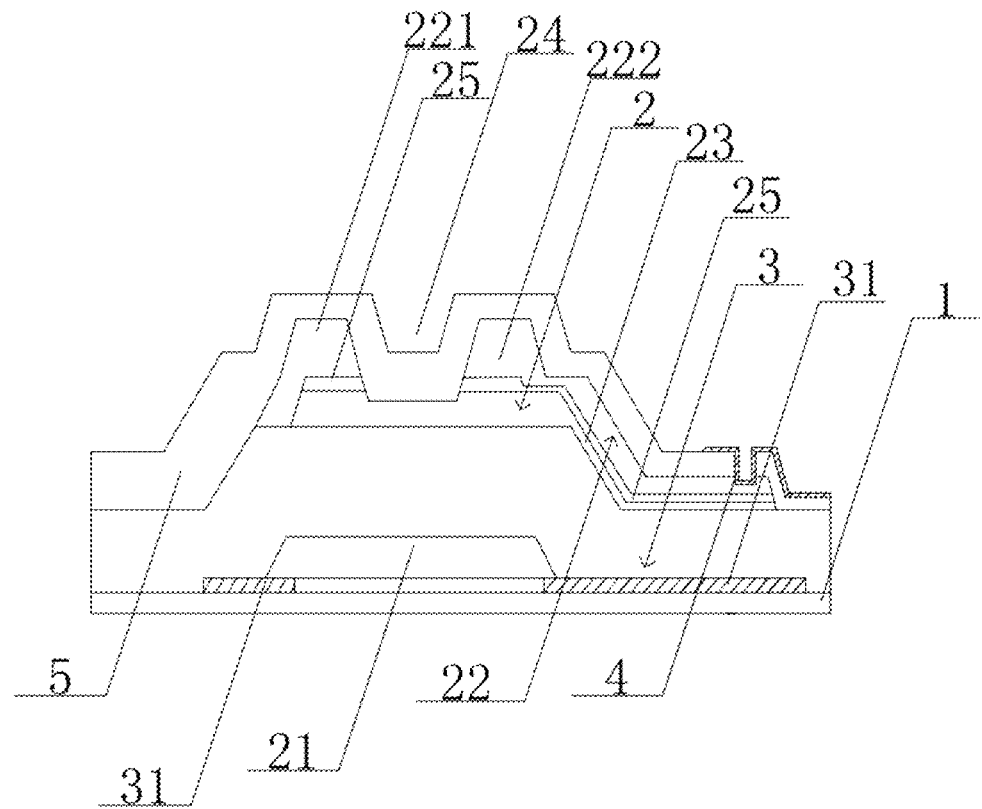
FIG. 5 is a schematically cross-sectional view showing a display panel according to another embodying method of the embodiment of this disclosure.

As shown in FIG. 5, the display panel of this embodiment comprises a substrate 1 and active switches 2 disposed on the substrate 1. A light-obstructing layer 3 is disposed between the active switches 2 and the substrate 1. The active switch 2 comprises a semiconductor layer 23. The light-obstructing layer 3 comprises a first metal layer 21 and semi-transparent layers 31 disposed below the semiconductor layer 23. The light-obstructing layer 3 entirely covers the semiconductor layer 23. The first metal layer 21 is disposed on the semi-transparent layers 31. The semi-transparent layers 31 are intervally disposed on the substrate 1. The first metal layer 21 crosses an interval region between adjacent two of the semi-transparent layers 31. Two ends of the first metal layer 21 are respectively disposed on adjacent two of the semi-transparent layers 31, and the semi-transparent layers 31 and the first metal layer 21 entirely cover the semiconductor layer 23.

Through the cooperation of the semi-transparent layers 31 and the first metal layer 21, the semi-transparent layers 31 and the metal layer can obstruct the backlight very effectively. This configuration can reduce the backlight illumination on the semiconductor layer 23 very well, further reduce the light exposure leakage current of the semiconductor layer 23, thus effectively reduce the influence of the light exposure leakage current on the frame display, and better improve the display effect of the display panel. In addition, the consumable material for production can be saved very effectively, the manufacturing cost can be further reduced, and thus the product competitiveness of the display panel can be better improved. Meanwhile, the weight of the display panel can be reduced very well to facilitate the carrying and transporting of the display panel.

The first metal layer 21 and the semi-transparent layers 31 are manufactured by using the same mask. The structure of the active switch 2 is still based on four mask structures. It is very convenient to the manufacture production of the display panel without adding a mask and the further reduction of the manufacturing costs of the display panel. In addition, the production efficiency of the display panel can further be improved very well. Utilizing one semi-transparent layer 31 to cooperate with a halftone mask 6 can obstruct the range of the semiconductor layer 23 exposed to the first metal layer 21 very effectively by the semi-transparent layer 31.

In one embodiment, the active switch 2 comprises a second metal layer 22, and the second metal layer 22 comprises a source metal layer 221 and a drain metal layer 222. The source metal layer 221 and the drain metal layer 222 are disposed on two ends of the semiconductor layer 23. A trench 24 is disposed between the source metal layer 221 and the drain metal layer 222, and a bottom portion of the trench 24 is the semiconductor layer 23.

In one embodiment, a nitrogen ion layer 25 is disposed between the semiconductor layer 23 and each of the source metal layer 221 and the drain metal layer 222. The configuration of the nitrogen ion layer 25 can stop the holes very well, effectively avoid other leakage current appearances, can effectively reduce the influence of the light exposure leakage current on the frame display of the display panel, ensure the better display effect of the display panel, and further improve the display quality of the display panel.

In one embodiment, a lower portion of the first metal layer 21 comprises a first high attachment metal layer 211, an upper portion of the first metal layer 21 comprises a second high attachment metal layer 213, and a middle portion of the first metal layer 21 comprises a middle electroconductive layer 212. The middle electroconductive layer 212 may be made of the metal with the lower resistive property to effectively reduce the resistance and parasitic capacitance of the first metal layer 21 of the display panel. The first high attachment metal layer 211 and the second high attachment metal layer 213 of the first metal layer 21 are made of the metal with the better bonding property, so that the middle electroconductive layer 212 may be bonded and fixed to the first high attachment metal layer 211 and the second high attachment metal layer 213 very well. Meanwhile, the middle electroconductive layer 212 may further be bonded and fixed to the upper and lower portions through the first high attachment metal layer 211 and the second high attachment metal layer 213, so that the bonding property is better, the condition that the middle electroconductive layer 212 is peeled off the upper and lower portions cannot easily occur, the electrical property performance of the first metal layer 21 of the display panel can be satisfied very well, the middle electroconductive layer 212 can be bonded and fixed to the upper and lower portions very well, the product yield is increased, and the manufacturing cost is reduced.

The width of the bottom portion of the middle electroconductive layer 212 is greater than the width of the top portion of the middle electroconductive layer 212, so that the manufacturing is convenient, the formation is stable, and the yield is high. The width of the first high attachment metal layer 211 is equal to the width of the bottom portion of the middle electroconductive layer 212, and the width of the second high attachment metal layer 213 is the same as the width of the top portion of the middle electroconductive layer 212. This is convenient to the manufacturing. The contact area between the middle electroconductive layer 212 and each of the first high attachment metal layer 211 and the second high attachment metal layer 213 is the maximum, and the bonding effect is better. The middle electroconductive layer 212 is preferred a trapezoid, and more particularly an isosceles trapezoid. The thickness of the middle electroconductive layer 212 is greater than the thickness of each of the first high attachment metal layer 211 and the second high attachment metal layer 213. The thickness of the middle electroconductive layer 212 is greater than the thickness of the first high attachment metal layer 211, and is also greater than the thickness of the second high attachment metal layer 213. The middle electroconductive layer 212 may be made of the metal having the lower resistive property, and has the larger thickness to effectively reduce the resistance and parasitic capacitance of the first wire layer of the display panel. The first high attachment metal layer 211 and the second high attachment metal layer 213 are made of the metal with the better bonding property. The middle electroconductive layer 212 is connected to the upper and lower portions through the first high attachment metal layer 211 and the second high attachment metal layer 213, so that the bonding property is better, and the condition that the middle electroconductive layer 212 is peeled off the upper and lower portions cannot easily occur. The first high attachment metal layer 211 and the second high attachment metal layer 213 are mainly used to be bonded to the upper and lower portions and have the small thickness to save the cost. Optionally, the thickness of the middle electroconductive layer 212 may be greater than the thickness of the first high attachment metal layer 211 plus the thickness of the second high attachment metal layer 213.

Figure 6:
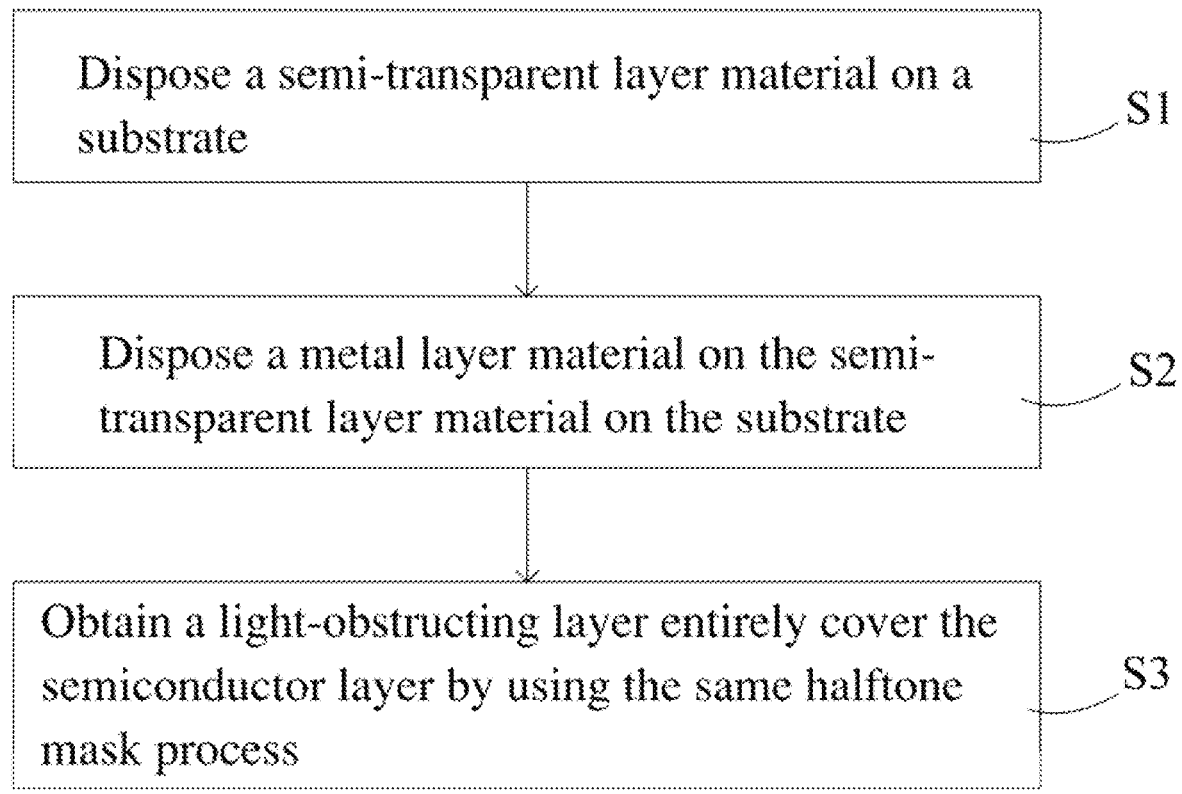
FIG. 6 is a schematic view showing a method of manufacturing the display panel according to the embodiment of this disclosure.

As shown in FIG. 6, according to another aspect of this disclosure, as shown in FIG. 5, this disclosure further discloses a display panel process including: a step S1 of disposing a semi-transparent layer material on a substrate; a step S2 of disposing a metal layer material on the semi-transparent layer material on the substrate; and a step S3 of obtaining a light-obstructing layer entirely covering the semiconductor layer by using the same halftone mask process.

A semi-transparent layer material 63 and a metal layer 62 are manufactured to obtain the first metal layer 21 and the semi-transparent layers 31 through one halftone mask 6. It is very convenient to the manufacture production of the display panel without adding a mask and the further reduction of the manufacturing costs of the display panel. In addition, the production efficiency of the display panel can further be improved very well.

Figure 7:
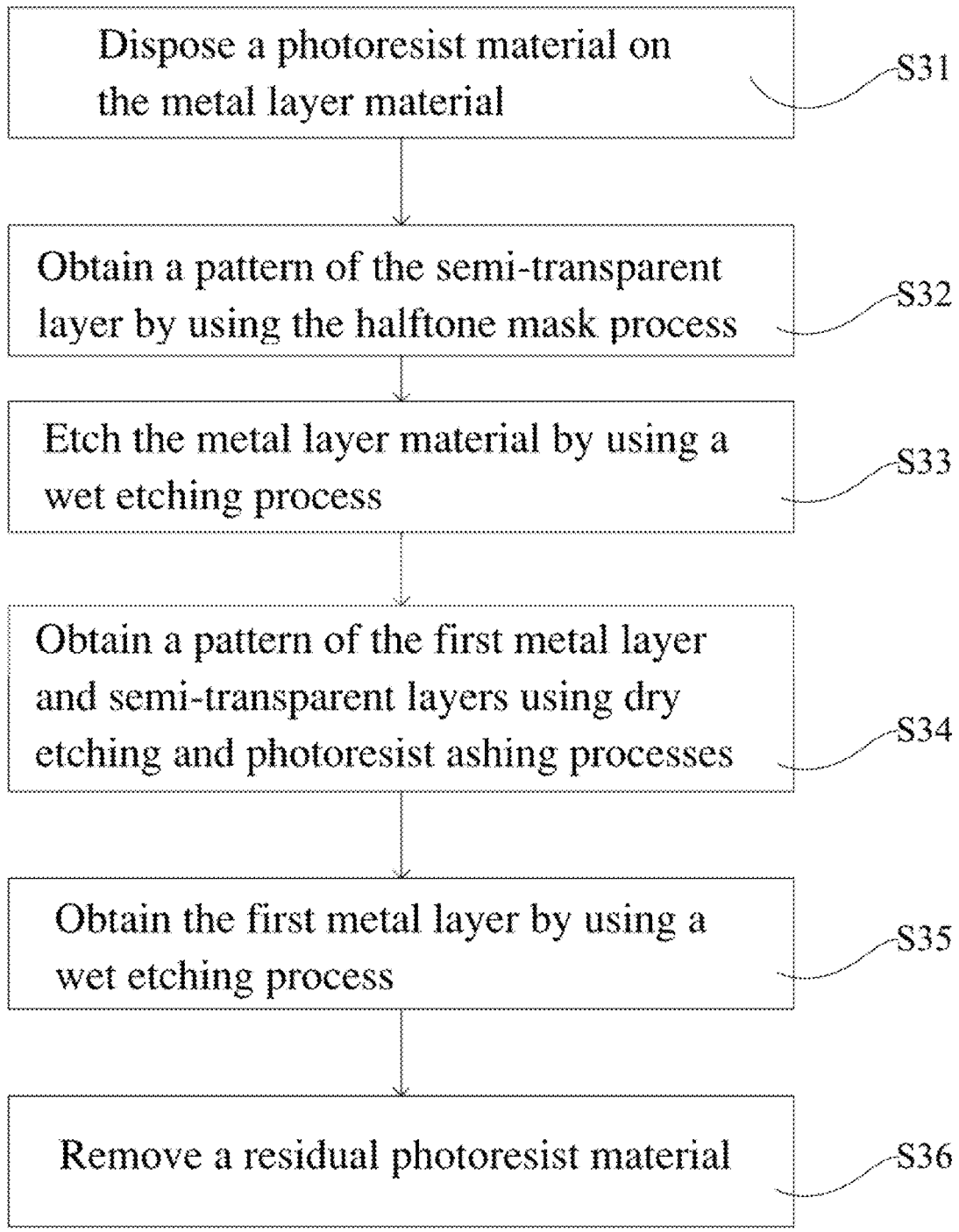
FIG. 7 is a schematic view showing a method of manufacturing the display panel according to the embodiment of this disclosure.

As shown in FIG. 7, the step of obtaining the light-obstructing layer through the one halftone mask includes: a step S31 of disposing a photoresist material on the metal layer material; a step S32 of obtaining a pattern of the semi-transparent layer by using the halftone mask process; a step S33 of etching the metal layer material by using a wet etching process; a step S34 of obtaining a pattern of the first metal layer and the semi-transparent layers by using dry etching and photoresist ashing processes; a step S35 of obtaining the first metal layer by using a wet etching process; and a step S36 of removing a residual photoresist material.

First, the semi-transparent layer material 63 and the material of the metal layer 62 are deposited on the substrate 1, wherein the property of the semi-transparent layer material 63 needs to be selected according to both the penetration rate and the aperture ratio. Then, a photoresist material 61 is disposed on the material of the metal layer 62. The halftone mask 6 is used to perform the photolithography process. Next, the first wet etching process is performed on the metal layer 62. Then, the dry etching and photoresist ashing processes are performed on the semi-transparent layers 31. Next, the second wet etching process is performed on the metal layer 62, and finally the photoresist is removed to obtain the structure of preventing the backlight from illuminating the semiconductor layer 23, wherein the subsequent processes of the active switch 2 are standard processes.

According to another aspect of this disclosure, this disclosure further discloses a display device, which includes the above-mentioned display panel. The specific structure and connection relationship associated with the display panel may be found in FIGS. 1 to 4, and detailed descriptions thereof will be omitted.

In the above embodiment, the material of the substrate can be optionally glass or plastics.

In the above embodiment, the display panel comprises liquid crystal panel, OLED panel, curved panel, plasma panel, and the likes. Taking a liquid crystal panel as an example, the liquid crystal panel comprises a TFT substrate and a CF substrate, which are disposed opposite to each other. The liquid crystal molecules and photo spacers are disposed between the TFT substrate and the CF substrate. The TFT substrate is configured with active switches, which can be thin-film transistors, and the CF substrate is configured with a color filter layer.

In the above embodiment, the CF substrate can also be configured with the TFT array, and the color filter layer and the TFT array are disposed on the same substrate. Alternatively, the TFT may also comprise the color filter layer.

In the above embodiment, the display panel of the disclosure can be a curved panel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a substrate; and
   active switches disposed on the substrate;
   wherein a light-obstructing layer is disposed between the active switches and the substrate, each of the active switches comprises a semiconductor layer, and the light-obstructing layer entirely covers the semiconductor layer,
   wherein the light-obstructing layer comprises a first metal layer and semi-transparent layers disposed below the semiconductor layer; the first metal layer is disposed on the semi-transparent layers, and the semi-transparent layers entirely cover the semiconductor layer,
   wherein the semi-transparent layers are intervally disposed on the substrate, the first metal layer crosses an interval region between adjacent two of the semi-transparent layers, two ends of the first metal layer are respectively disposed on adjacent two of the semi-transparent layers, and the semi-transparent layers and the first metal layer entirely cover the semiconductor layer.

2. The display panel according to claim 1, wherein the first metal layer and the semi-transparent layers are manufactured by using the same mask.

3. The display panel according to claim 2, wherein each of the active switches comprises a second metal layer, the second metal layer comprises a source metal layer and a drain metal layer, the source metal layer and the drain metal layer are disposed on two ends of the semiconductor layer, a trench is disposed between the source metal layer and the drain metal layer, and a bottom portion of the trench is the semiconductor layer.

4. The display panel according to claim 3, wherein a nitrogen ion layer is disposed between the semiconductor layer and each of the source metal layer and the drain metal layer.

5. The display panel according to claim 1, wherein a lower portion of the first metal layer comprises a first high attachment metal layer, an upper portion of the first metal layer comprises a second high attachment metal layer, and a middle portion of the first metal layer comprises a middle electroconductive layer.

6. The display panel according to claim 5, wherein a width of a bottom portion of the middle electroconductive layer is greater than a width of a top portion of the middle electroconductive layer, and a thickness of the middle electroconductive layer is greater than a thickness of the first high attachment metal layer and a thickness of the second high attachment metal layer.

7. The display panel according to claim 5, wherein a thickness of the middle electroconductive layer is greater than a thickness of the first high attachment metal layer plus a thickness of the second high attachment metal layer.

8. The display panel according to claim 5, wherein the middle electroconductive layer is made of copper, aluminum, silver, gold, chromium or molybdenum or an alloy of copper, aluminum, silver, gold, chromium or molybdenum.

9. The display panel according to claim 5, wherein the first high attachment metal layer and the second high attachment metal layer are made of molybdenum or a molybdenum alloy.

10. The display panel according to claim 5, wherein the first high attachment metal layer and a bottom portion of the middle electroconductive layer have the same width, and the second high attachment metal layer and a top portion of the middle electroconductive layer have the same width.

11. The display panel according to claim 5, wherein a transversal cross section of the middle electroconductive layer is an isosceles trapezoid.

12. The display panel according to claim 5, wherein the first metal layer is provided with the second high attachment metal layer on a gate metal layer.

13. The display panel according to claim 2, wherein the mask is a halftone mask.

14. A display panel, comprising:
a substrate; and
active switches disposed on the substrate;
wherein a light-obstructing layer is disposed between the active switches and the substrate, each of the active switches comprises a semiconductor layer, and the light-obstructing layer entirely covers the semiconductor layer; the light-obstructing layer comprises a first metal layer and semi-transparent layers disposed below the semiconductor layer; the first metal layer is disposed on the semi-transparent layers, and the semi-transparent layers entirely cover the semiconductor layer; the semi-transparent layers are intervally disposed on the substrate, the first metal layer crosses an interval region between adjacent two of the semi-transparent layers, two ends of the first metal layer are respectively disposed on adjacent two of the semi-transparent layers, and the semi-transparent layers and the first metal layer entirely cover the semiconductor layer; the first metal layer and the semi-transparent layers are manufactured by using the same mask; each of the active switches further comprises a second metal layer, the second metal layer comprises a source metal layer and a drain metal layer, the source metal layer and the drain metal layer are disposed on two ends of the semiconductor layer, a trench is disposed between the source metal layer and the drain metal layer, and a bottom portion of the trench is the semiconductor layer.

* * * * *